(12) United States Patent
Knierim et al.

(10) Patent No.: US 12,372,550 B2
(45) Date of Patent: Jul. 29, 2025

(54) ISOLATED PROBE TIP

(71) Applicant: Tektronix, Inc., Beaverton, OR (US)

(72) Inventors: Daniel G. Knierim, Beaverton, OR (US); Josiah A. Bartlett, Forest Grove, OR (US); Andrew W. Rusinek, Porltand, OR (US); David Thomas Engquist, Portland, OR (US)

( * ) Notice: Subject to any disclaimer, the term of this patent is extended or adjusted under 35 U.S.C. 154(b) by 398 days.

(21) Appl. No.: 17/730,096

(22) Filed: Apr. 26, 2022

(65) Prior Publication Data

US 2022/0349917 A1 Nov. 3, 2022

Related U.S. Application Data

(60) Provisional application No. 63/181,922, filed on Apr. 29, 2021.

(51) Int. Cl.
*G01R 1/067* (2006.01)
*G01R 1/02* (2006.01)
(Continued)

(52) U.S. Cl.
CPC ...... *G01R 1/06711* (2013.01); *G01R 31/2886* (2013.01); *H05K 9/0069* (2013.01)

(58) Field of Classification Search
CPC . G01R 1/02; G01R 1/04; G01R 1/067; G01R 1/073; G01R 1/18; G01R 31/02; G01R 31/06; G01R 31/28
See application file for complete search history.

(56) References Cited

U.S. PATENT DOCUMENTS 6,876,183 B2 * 4/2005 Cannon ............... G01R 1/0416
439/578
2008/0309514 A1 * 12/2008 Hall .................... G01V 11/002
439/13
(Continued)

FOREIGN PATENT DOCUMENTS

CN       107870020      * 12/2017 ........... G01F 23/266
WO   WO-2013102420 A1 *  7/2013 ........... G01N 27/622
WO   WO-2020026293 A1 *  2/2020 ............. G01Q 30/02

*Primary Examiner* — Neel D Shah
(74) *Attorney, Agent, or Firm* — Miller Nash LLP; Andrew J. Harrington

(57) ABSTRACT

A probe tip for an isolated probe having a triaxial cable has a conductive probe tip interface at one end of the cable, a signal conductor, the signal conductor traversing a length of the cable and electrically connected to the conductive probe tip interface, a reference conductor surrounding the signal conductor along the length of the cable, a shield conductor surrounding the reference conductor at least along the length of the cable, the shield conductor and the reference conductor electrically connected at ends of the probe tip, a first insulator between the signal conductor and the reference conductor along the length of the cable, a second insulator between the reference conductor and the shield conductor along the length of the cable, and high magnetic permeability material inside the shield conductor. A method of manufacturing a tip for an isolated probe having a triaxial cable includes accessing a shield conductor of the triaxial cable, inserting a high magnetic permeability material between the shield conductor and a reference conductor in the triaxial cable, electrically connecting the shield conductor to the reference conductor. A triaxial cable has a signal conductor, the signal conductor traversing a length of the cable, a reference conductor surrounding the signal conductor along the length of the cable, a shield conductor surrounding the reference conductor along the length of the cable, the shield (Continued)

conductor and the reference conductor electrically connected at ends of the cable, a first insulator between the signal conductor and the reference conductor along the length of the cable, a second insulator between the reference conductor and the shield conductor along the length of the cable, and high magnetic permeability material inside the shield conductor.

20 Claims, 13 Drawing Sheets

(51) Int. Cl.
*G01R 1/04* (2006.01)
*G01R 1/073* (2006.01)
*G01R 31/26* (2020.01)
*G01R 31/28* (2006.01)
*H05K 9/00* (2006.01)

(56) References Cited

U.S. PATENT DOCUMENTS

2012/0138361 A1* 6/2012 Elliott .................. H01R 9/05
174/74 R
2017/0271826 A1* 9/2017 Mende .................. G01R 1/18

* cited by examiner

ISOLATED PROBE TIP

RELATED APPLICATIONS

This disclosure claims benefit of U.S. Provisional Patent Application No. 63/181,922 titled "TRIAXIAL ISOLATED PROBE TIP," filed Apr. 29, 2021, which is incorporated herein in its entirety.

TECHNICAL FIELD

This disclosure relates to test and measurement systems, and more particularly to a test and measurement probe.

BACKGROUND

Test and measurement systems often include a test and measurement instrument, such as an oscilloscope, and a test and measurement probe. The probe is generally used to physically connect to one or more test points on a device under test (DUT), and couple a signal of interest from the test point to an input of the test and measurement instrument. An isolated probe, such as an IsoVu™ probe from Tektronix, Inc., uses galvanic, such as optical, or RF isolation to divorce the reference voltage of the probe from the reference voltage of the oscilloscope, typically earth ground. This enables users, such as power designers, to accurately resolve high bandwidth, high voltage differential signals in the presence of large common mode voltages. Example applications for using an isolated probe may include switched mode power supply design, power FET (field-effect transistors) design/analysis for Wide Bandgap GaN (gallium nitride) and SiC (silicon carbide) devices, inverter design, motor drive design, BCI (bulk channel injection) or ESD (electrostatic discharge) measurements, and current shunt measurements, among many others. The ability of an isolated probe to reject a common mode voltage is measured by the probe's common mode rejection ratio (CMRR).

An isolated probe typically includes a sensor head portion, and a probe tip that extends from the sensor head to the test point on the DUT. Isolated probe tips typically have a degradation in CMRR, which is correlated with their length. This is because the common-mode signal current travels over the entire length of the reference, or isolated "ground" braid, which can result in considerable loss at high frequencies. This creates a voltage differential at the entry to the sensor head between the signal conductor and the reference conductor, resulting in poor CMRR performance.

Consequently, conventional tips for isolated probes are typically designed to be relatively short in length. For example, currently available probe tips for Tektronix's IsoVu™ isolated probes contain no options that are longer than 6 inches in cable length. The shortness in length helps tremendously to maintain stellar CMRR performance, but makes it difficult to use these probe tips for measurements that must navigate narrow confines, for example to reach inside an environmental chamber to test a DUT at expanded temperature ratings. IsoVu™ probe tips generally include a coaxial cable with a center conductor and reference braid that are each fed through a series of ferrites, as described in U.S. Pat. No. 10,302,676, the entire contents of which are hereby incorporated by reference into this disclosure.

Embodiments of the disclosed apparatus and methods address shortcomings in the prior art.

DETAILED DESCRIPTION

The embodiments here involve a triaxial cable in which the common mode current travels a path away from the reference conductor. This reduces the current that travels through the reference conductor, sometimes referred to as the ground or reference braid. For high frequency signals, meaning those in the radio frequency range of 20 kHz to 300 GHz, this can cause even more of an issue. Reducing the current through the reference braid increases the common-mode rejection ratio (CMRR) that leads to higher accuracy measurements on the instrument measuring signals.

Figure 1:
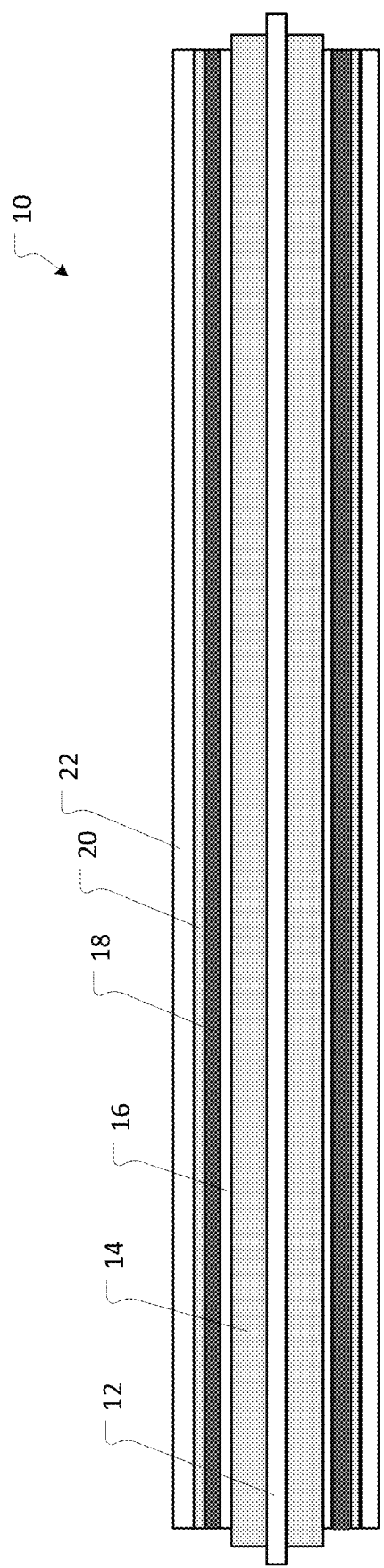
FIG. 1 shows a diagram of a portion of a conventional triaxial cable.

FIG. 1 shows a diagram of a portion of a conventional triaxial cable. As used here, the terms "coaxial" or "coax" means a cable comprised of a center, or signal, conductor, surrounded by an insulator, in turn surrounded by a second, or reference, conductor. The second conductor typically comprises a braid. The terms "triaxial" or "triax" refers to a cable having a second insulator and a third, or shield, conductor, also usually comprising a braid. This discussion refers to these components as traversing or running the length of the cable, along the axis of the cable. The term "insulator" as used here includes materials that provide electrical insulation, including dielectrics that may become polarized by an applied electric field.

In FIG. 1, the triaxial cable 10 has a signal conductor 12 surrounded by a first insulator 14. A reference conductor 16, which this discussion may refer to as the ground, reference or inner conductor, surrounds the first insulator. A second insulator 18 surrounds the reference conductor, in turn surrounded by a third, or shield, conductor 20. A jacket or sheath 22 may encases these components to form the cable. The lower layers of the cable below the center conductor 12 match the upper layers, as this is a side view of the length of the cable.

As discussed above, when a probe tip in an isolated test and measurement device uses a coaxial cable, the measurement suffers because the common mode current that flows through the reference conductor of the coax creates a voltage drop that is in series with the differential measurement being made between the signal and reference conductors. Triaxial cables are sometimes used to route the common mode current in a separate shield conductor, but this generally requires a differential input stage in the test and measurement device so that the reference conductor does not form a secondary path for common mode current flow.

Generally, most conventional tips for isolated probes use a standard coaxial cable having two conductors shorter than 6 inches in length. The shortness helps to maintain good CMRR performance by minimizing the length and therefore the resistance of the reference conductor. However, the short length makes it difficult to use these products for measurements that must navigate narrow confines, such as reaching inside an environmental chamber to test a DUT at expanded temperatures. On a conventional coax isolated probe tip, there will be ferrites outside the reference conductor. The triax approach adds an additional shield conductor and additional ferrites outside the shield conductor. The improvements in CMRR could allow development of longer tips.

The embodiments here use a high magnetic permeability material, such as ferrites, inserted between the reference and shield conductors of a triaxial cable. This increases the common mode impedance in the reference conductor relative to the shield, pushing the common mode current to the shield conductor. This technique may be combined with use of a high magnetic permeability material outside the shield to minimize total common mode current flow while directing what common mode current flow remains into the shield rather than the reference. A high magnetic permeability material may comprise a material that has high magnetic permeability, low electrical conductivity, and is lossy. Magnetic permeability is the measure of magnetization that a material obtains in response to an applied magnetic field. For purposes of this discussion, a material having "high magnetic permeability" has a magnetic permeability one or more orders of magnitude above $\mu_0$ (the permeability of free space).

Figure 2:
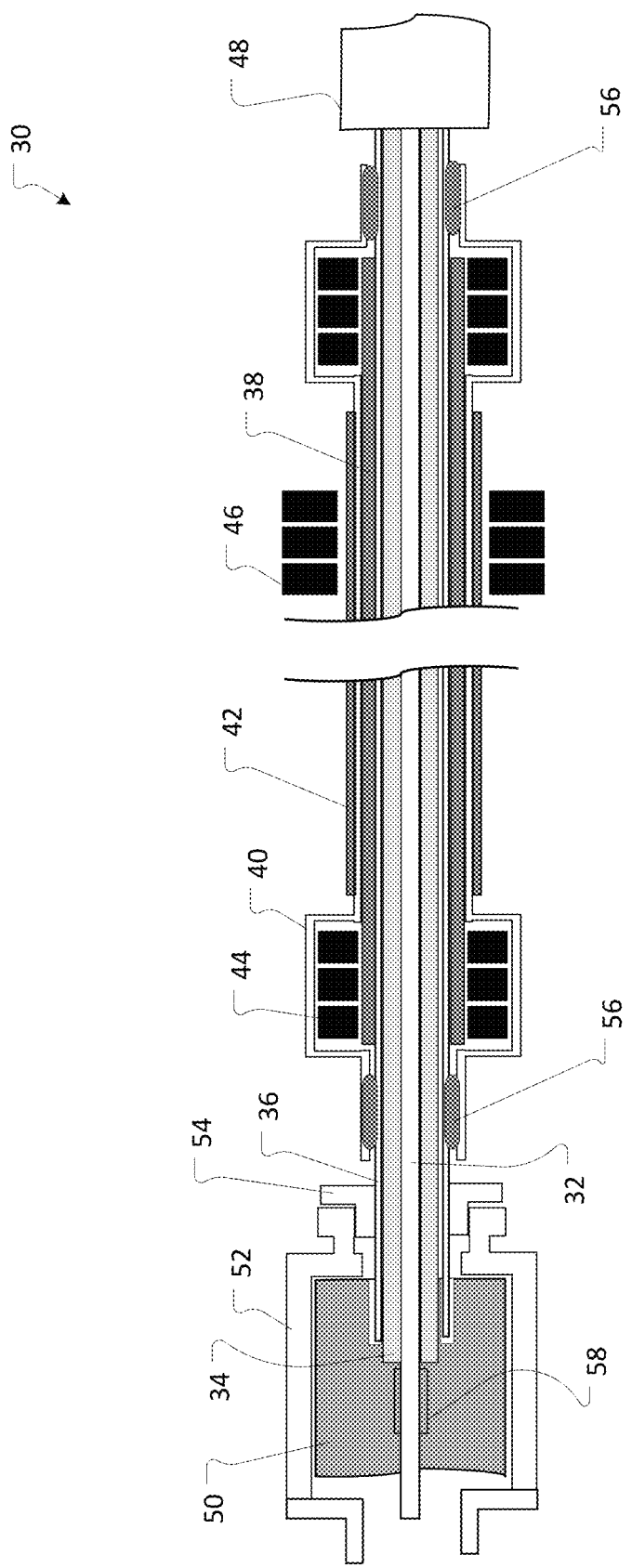
FIG. 2 shows a diagram of a portion of an embodiment of a probe tip having a triaxial cable.

FIG. 2 shows an embodiment of a probe tip using a triax cable having high magnetic permeability material inside the shield conductor. In essence, the high magnetic permeability material around the signal conductor and reference conductor, but not the shield conductor, form a balun, a device that converts between a balanced signal and an unbalanced signal. The balun prevents common-mode drop in the resistance of the shield conductor from affecting the differential signal from the signal conductor to the reference conductor.

Products of a similar length that use a standard coaxial design without the shield conductor will typically see CMRR performance of less than 20 dB at 500 MHz. The embodiments here, using a shield conductor with inner high magnetic permeability material offers CMRR performance of approximately 50 dB at 500 MHz. FIG. 2 shows an embodiment of such a design.

The triax cable 30 has a signal conductor 32, a first insulator 34, a reference conductor 36, a second insulator 38, and a shield conductor 40, optionally encased in a jacket 42. A high magnetic permeability material 44, in this case ferrites, reside between the shield conductor and the second insulator. One should note that the high magnetic permeability material might reside in more than one location in the cable. More than likely, they will reside near the test and measurement device to which the cable is connected, and near the other end by the probe tip interface 48. Note that this view is a side view and the conductors and insulators traverse at least the length of the cable. In one embodiment, the shield conductor traverses the length of the cable and extends beyond the end of the cable. The lower layers of the cable below the signal conductor 32 match the upper layers, as this is a cross-sectional side view of the length of the cable.

At the test and measurement device end, the signal conductor connects to a cable launch 58 on a printed circuit board 50. A metal or other conductive cylindrical shell 52 encloses the PCB 50. Solder or other material 54 connects the conductive cylindrical shell 52 to the reference conductor 36. Similarly, the solder 56 connects the shield conductor 40 to reference conductor 36 past the point where the second insulator 38 stops. More high magnetic permeability material 46 may reside outside the jacket or otherwise outside the shield conductor to increase the impedance and in turn minimize common mode loading of the circuit under test. In this manner, high magnetic permeability material 46 opposes common mode current flow in the entire cable, but the majority of any common mode current that does flow travels along the shield conductor 40 as the high magnetic permeability material 44 further opposes common mode current flow in the reference conductor.

Figure 3:
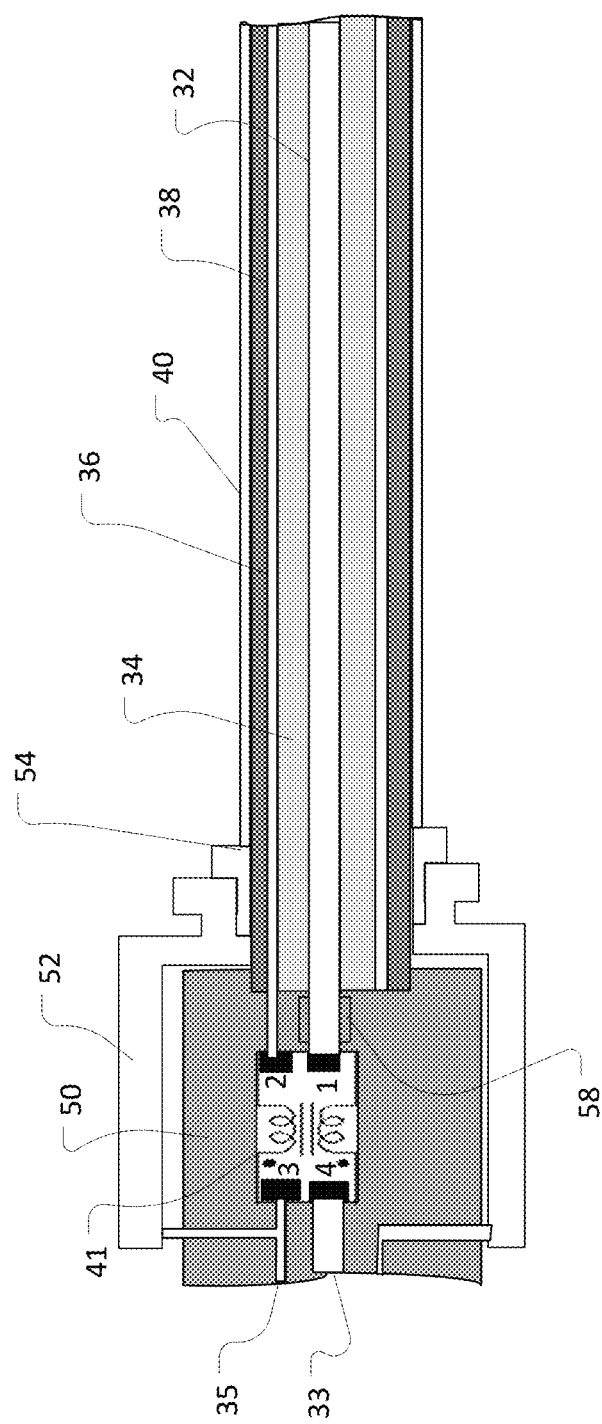
FIG. 3 shows a diagram of a portion of an embodiment of a probe tip having a triaxial cable.

In an alternative embodiment, the triax cable may connect electrically through a common mode choke as shown in FIG. 3. A common mode choke generally comprises a high magnetic permeability material in the form of a magnetic core contained inside a housing with connection points. The signal conductor 32 and the reference conductor 36 connect to pins or other connection points on the choke 41, with signal conductor 32 connecting to connection point 1 and reference conductor 36 connecting to connection point 2. On the other side of the choke, reference output 35 connects to connection point 3, and the signal output conductor of the probe tip 33 would connect to connection point 4. The signal flows through the choke from the signal conductor 32 to the output conductor 33.

The shield conductor 40 of the triax cable would connect to the conductive shell 52, effectively extending the shield conductor beyond the length of the cable. The high magnetic permeability material resides inside the shield conductor. The reference output 35 and connects to the shell 52, connecting the shield conductor to the reference conductor similar to the embodiment show in FIG. 2. One should note that this example shows the common mode choke at the PCB end of the embodiment of FIG. 2, but the common mode choke could reside at either end of the cable, or both.

FIGS. 4-13 show methods of manufacturing the triax cable with the inner high magnetic permeability material. The term 'manufacturing' may comprise modifying an existing triax cable or manufacturing one from the beginning. For simplicity, many of the components of the triax cable of FIG. 2 are not called out in the following figures but are still part of the cable. Generally, the process involves accessing the shield conductor in some manner, which may include unbraiding or peeling back the shield conductor. This would allow insertion of the high magnetic permeability material under the shield conductor. In an alternative method, the second insulator between the inner reference braid and the shield conductor may be manufactured with granular ferrite or other high magnetic permeability material in the insulator/dielectric.

Figure 4:
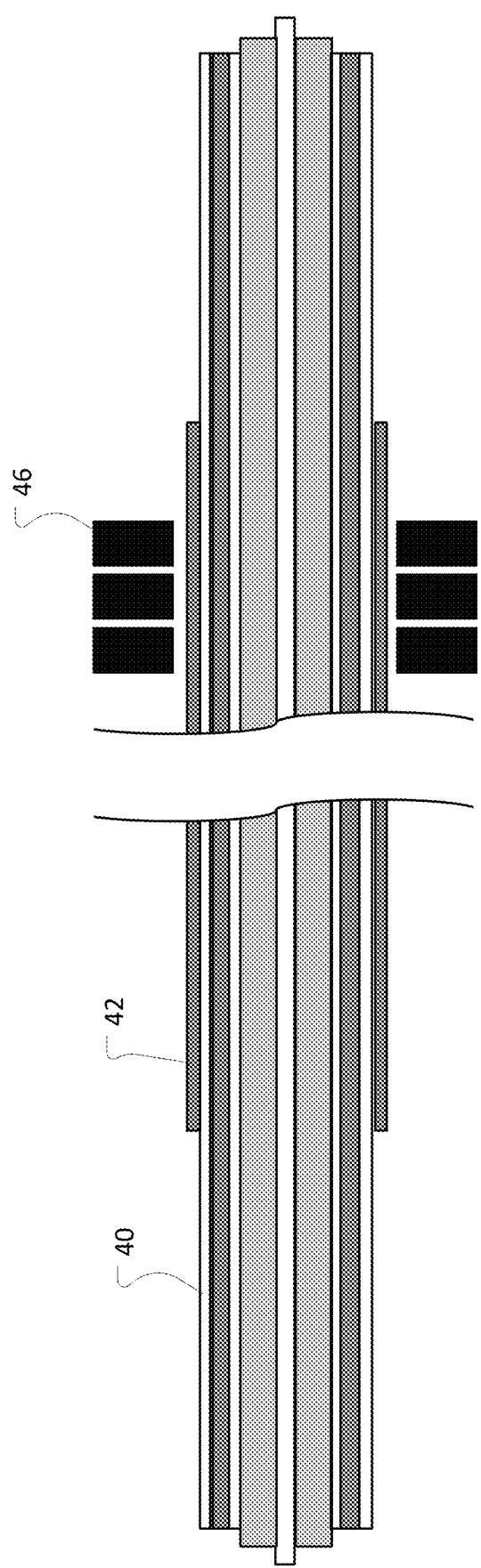
FIGS. 4-13 show methods of manufacturing a triaxial cable probe tip.
Figure 5:
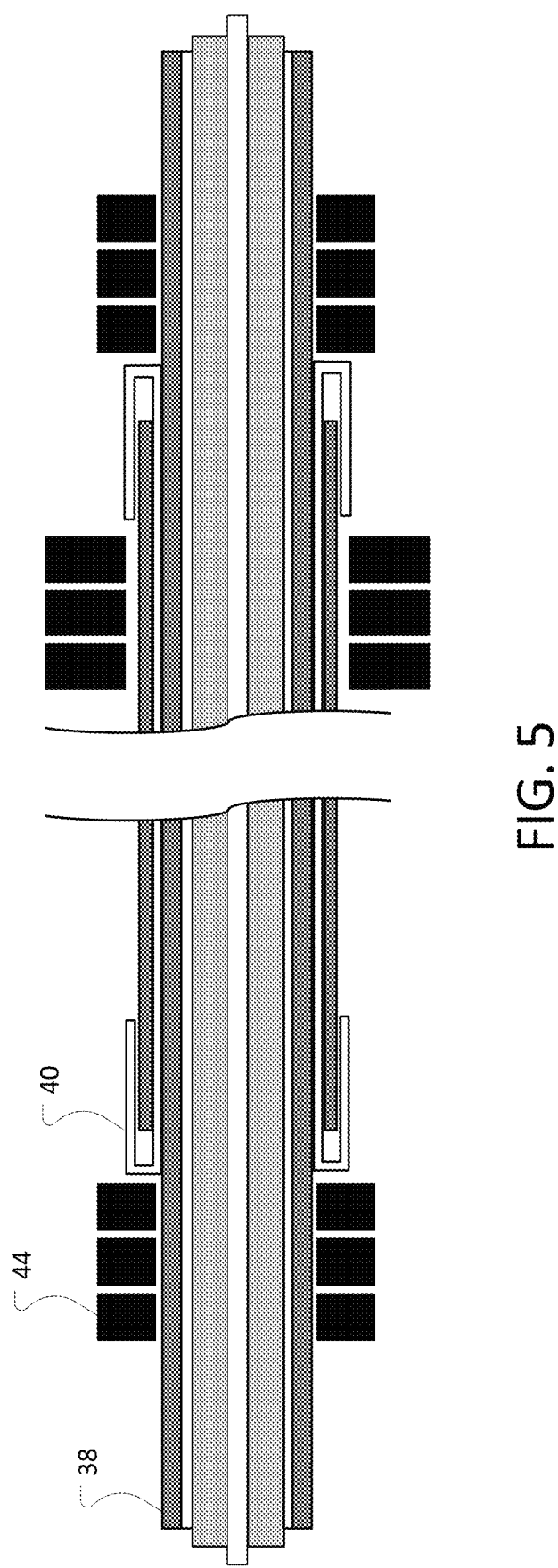

FIG. 4 shows the cable having a portion of the jacket/outer insulator 42 removed from a portion of each end of the cable. This exposes the shield conductor 40. The external high magnetic permeability material 46 lies outside the shield conductor and/or the outer insulator 42. FIG. 5 shows the inner high magnetic permeability material 44 on the second insulator 38.

Figure 6:
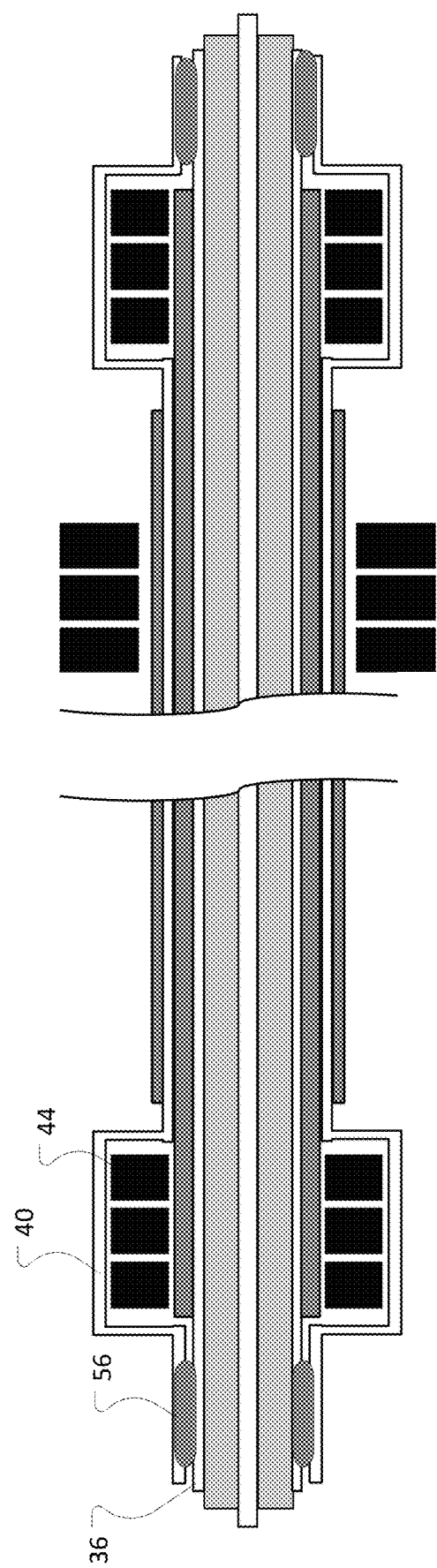

FIG. 6 shows the shield conductor 40 wrapped around the inner high magnetic permeability material 44. The shield conductor may wrap around the inner high magnetic permeability material itself. Alternatively, a larger diameter braid may be soldered to the shield conductor to enclose the high magnetic permeability material. Either the original shield conductor or the larger-diameter braid that now acts as the shield conductor is then soldered to the reference conductor 36 to form a cable in accordance with the embodiments.

Figure 7:
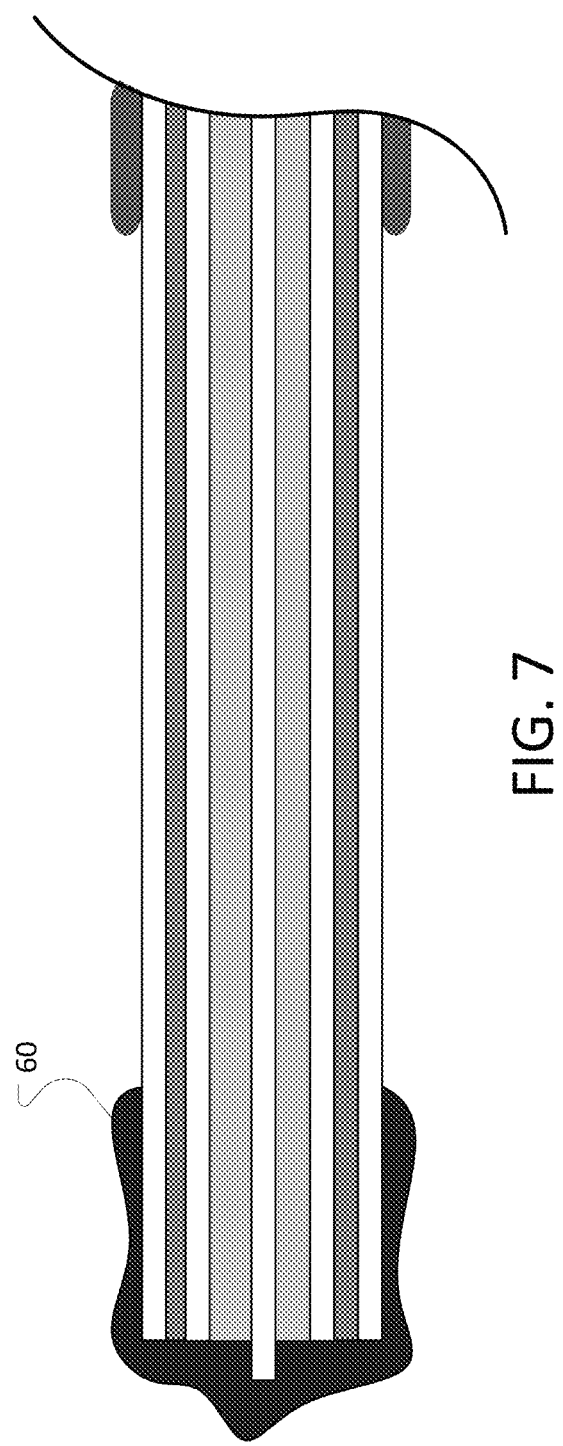

In another embodiment, the shield conductor may be expanded to provide access to allow the high magnetic permeability material to be inserted. In FIG. 7, which may also be used in other embodiments, an anti-fraying material 60 applied to the shield braid so that it will not fray as it expands. The anti-fraying material may comprise a material such as rubber cement, a material with good adhesive properties but also easily removable.

Figure 8:
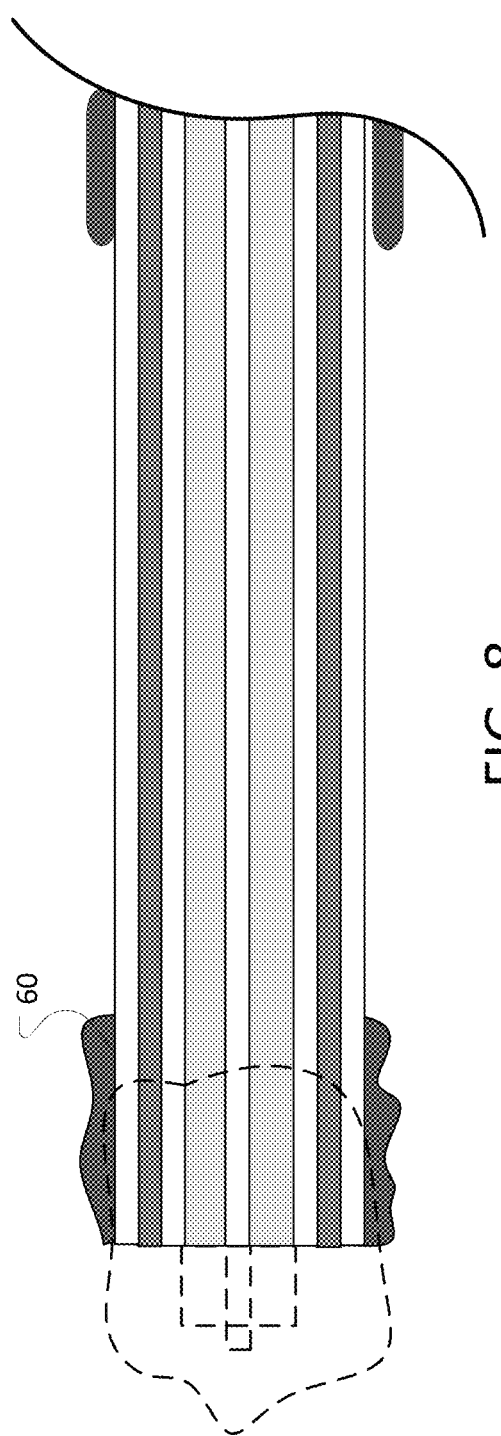
Figure 9:
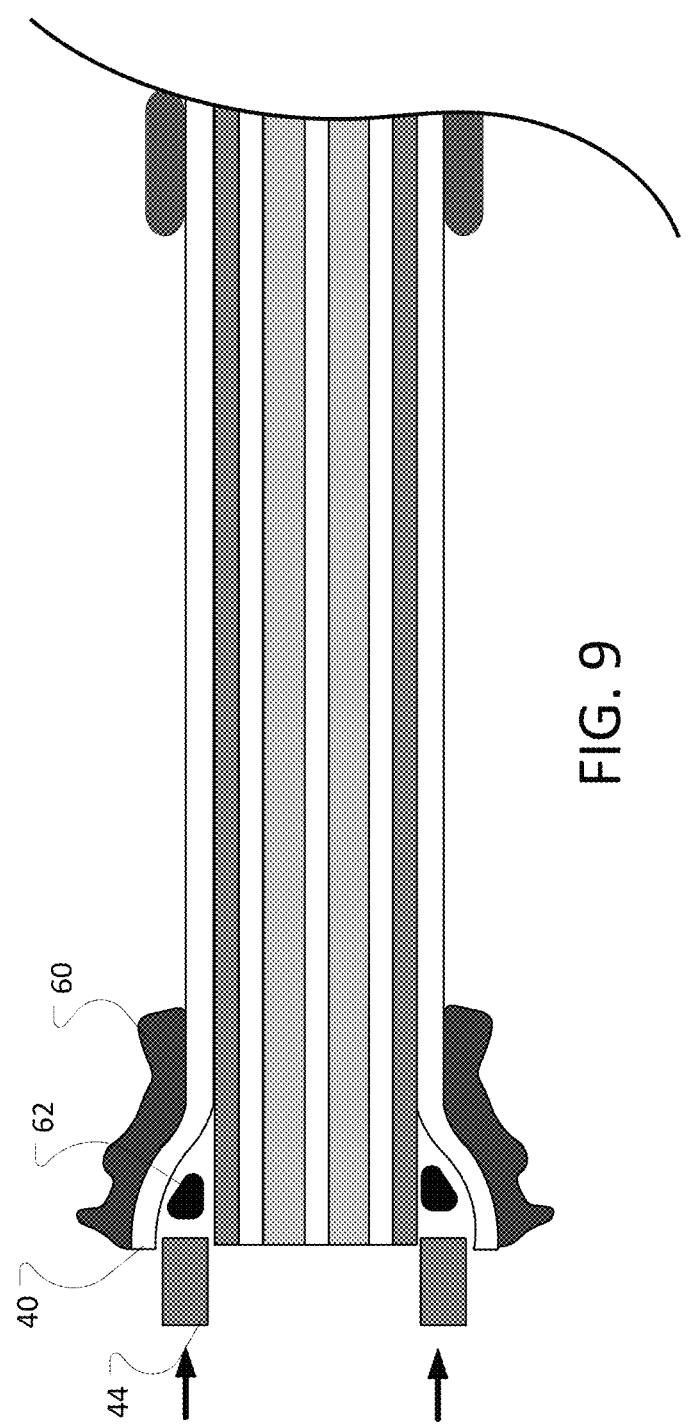
Figure 10:
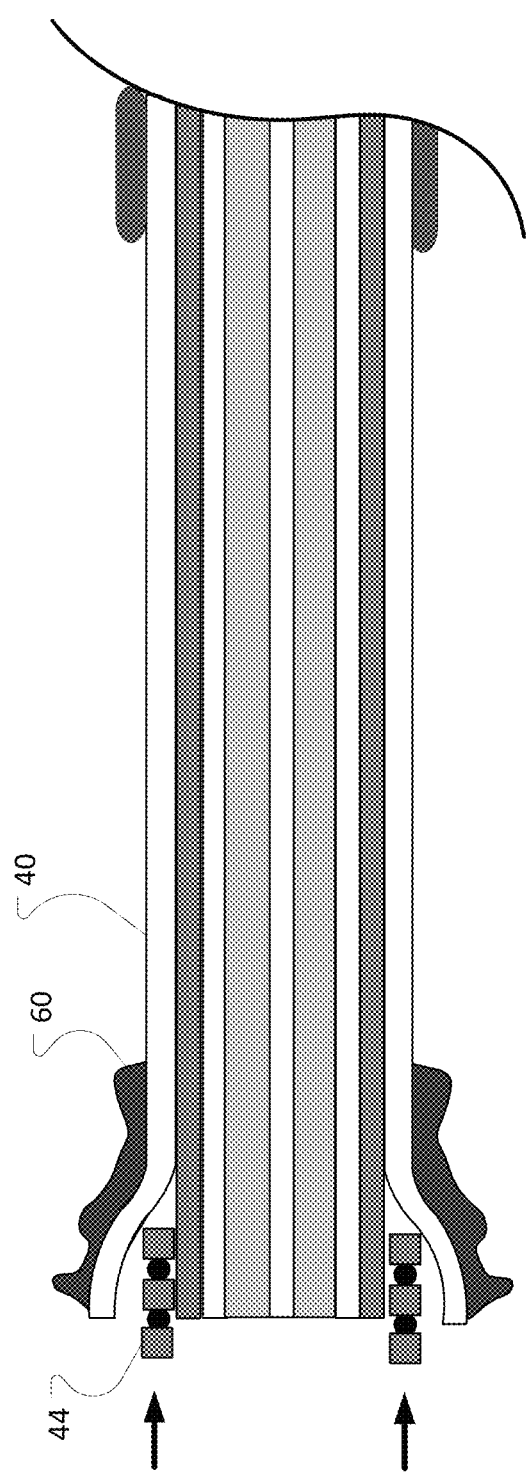

In FIG. 8, most of the end of the cable, including anti-fraying material 60, is trimmed back as shown by the dotted line. This allows access to the end of the shield conductor and outer insulator if one is used. In FIG. 9, the shield conductor 40 is expanded to allow access to insert the high magnetic permeability material 44. This may involve using some sort of non-absorbing material as a wedge 62 to expand the shield 40, such as plastic or Teflon®. Alternatively, as shown in FIG. 10, no wedge may be needed if the high magnetic permeability material is configured to allow the expansion.

Figure 11:
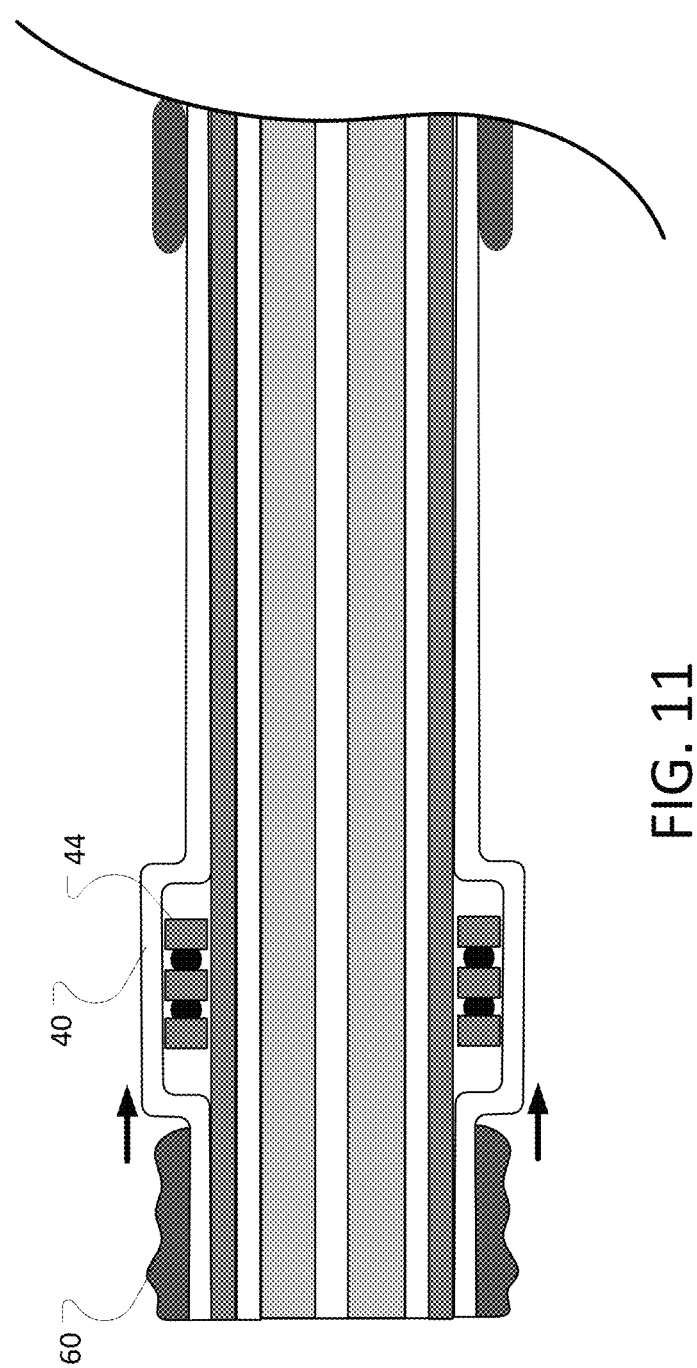
Figure 12:
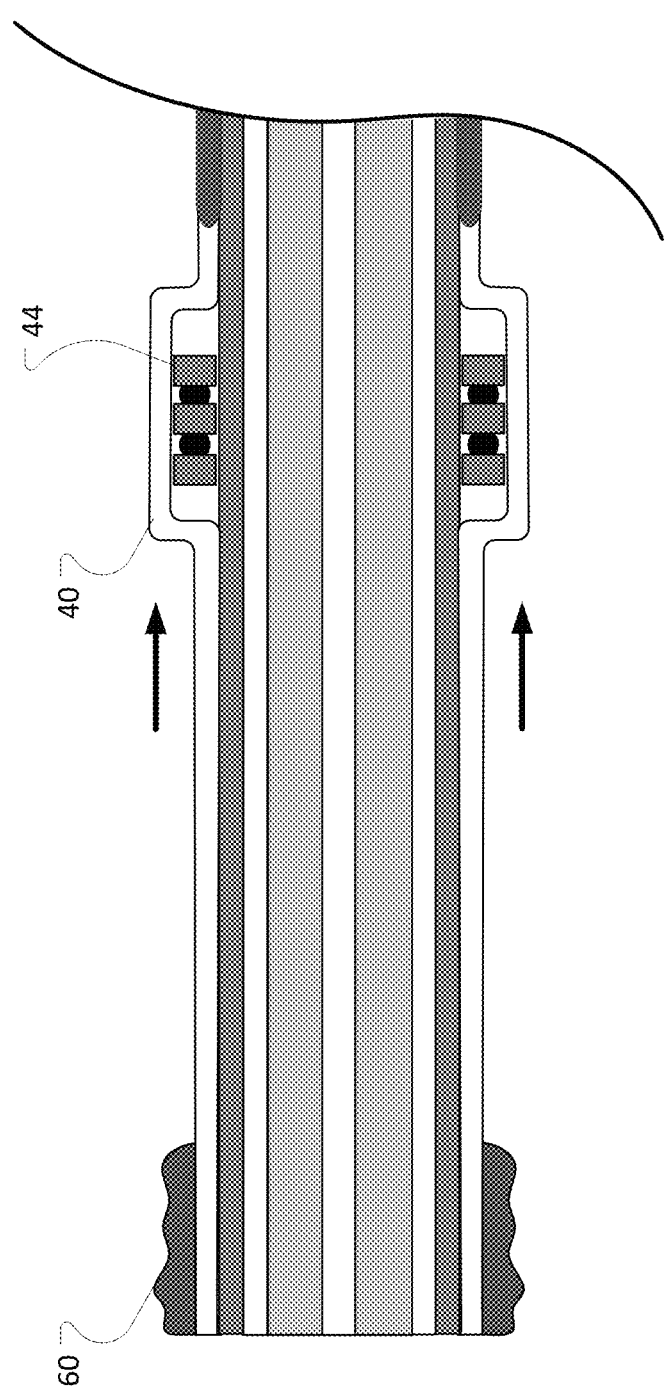
Figure 13:
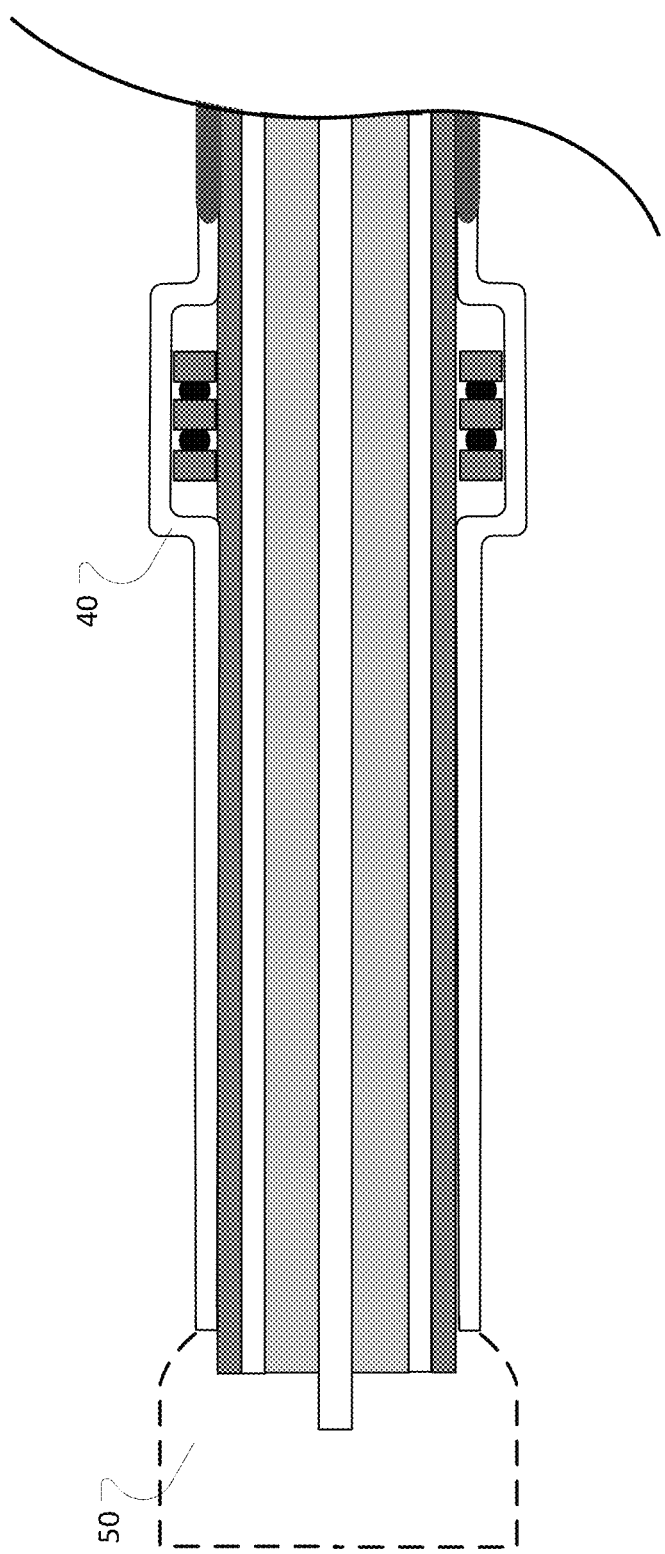

As shown in FIGS. 11 and 12, the high magnetic permeability material 44 may slide under the shield conductor 40 to reach its ultimate position shown in FIG. 12. Finally, as shown in FIG. 13, the anti-fraying material 60 is removed and the cable is connected to the PCB 50.

In this manner, the common mode current couples to the shield conductor of the cable. This allows the return path of the signal from the DUT to pass without interference that affects the measurement of the DUT signals. The embodiments provide for modification of existing cables, or development of a new cable having integrated high magnetic permeability material.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is a probe tip for an isolated probe having a triaxial cable, comprising: a conductive probe tip interface at one end of the cable; a signal conductor, the signal conductor traversing a length of the cable and electrically connected to the conductive probe tip interface; a reference conductor surrounding the signal conductor along the length of the cable; a shield conductor surrounding the reference conductor at least along the length of the cable, the shield conductor and the reference conductor electrically connected at ends of the probe tip; a first insulator between the signal conductor and the reference conductor along the length of the cable; a second insulator between the reference conductor and the shield conductor along the length of the cable; and high magnetic permeability material inside the shield conductor.

Example 2 is the probe tip of Example 1, wherein the high magnetic permeability material comprises a common mode choke at one or both ends of the cable, and the shield conductor further comprises a conductive shell housing the common mode choke.

Example 3 is the probe tip of either Example 1 or 2, further comprising high magnetic permeability material outside of the shield conductor.

Example 4 is the probe tip of any of Examples 1 through 3, further comprising a printed circuit board connected to an end of the cable opposite the conductive probe tip interface.

Example 5 is the probe tip of Example 4, wherein the printed circuit board includes a common mode choke.

Example 6 is the probe tip of any of Examples 1 through 5, wherein the high magnetic permeability material comprises a ferrite.

Example 7 is the probe tip of any of Examples 1 through 6, wherein the high magnetic permeability material inside the shield conductor lies between the shield conductor and the reference conductor.

Example 8 is the probe tip of any of Examples 1 through 7, wherein the high magnetic permeability material inside the shield conductor is integrated into material of the second insulator.

Example 9 is a method of manufacturing a tip for an isolated probe having a triaxial cable, comprising: accessing a shield conductor of the triaxial cable; inserting a high magnetic permeability material between the shield conductor and a reference conductor in the triaxial cable; and electrically connecting the shield conductor to the reference conductor.

Example 10 is the method of manufacturing of Example 9, further comprising placing high magnetic permeability material outside the shield conductor.

Example 11 is the method of manufacturing of either of Examples 9 and 10, wherein accessing the shield conductor comprises unbraiding the shield conductor at ends of the cable and wrapping the shield conductor over the high magnetic permeability material before electrically connecting the shield conductor to the reference conductor.

Example 12 is the method of manufacturing of any of Examples 9 through 11, wherein accessing the shield conductor comprises removing a portion of the shield conductor at ends of the cable, and the method further comprises: placing a braid having a larger diameter than the shield conductor at each end of the cable to hold the high magnetic permeability material; and soldering the larger diameter braid to the shield conductor.

Example 13 is the method of manufacturing of any of Examples 9 through 12, wherein: accessing the shield conductor comprises: coating an end of the cable with an anti-fraying material; trimming the anti-fraying material; and creating openings in an end of the cable, the openings exposing the shield conductor; inserting the high magnetic permeability material comprises sliding the high magnetic permeability material into the openings against the shield conductor; and removing the anti-fraying material.

Example 14 is the method of Example 13, wherein creating openings comprises using wedges of a material other than the high magnetic permeability material to expand the shield conductor.

Example 15 is a triaxial cable, comprising: a signal conductor, the signal conductor traversing a length of the cable; a reference conductor surrounding the signal conductor along the length of the cable; a shield conductor surrounding the reference conductor along the length of the cable, the shield conductor and the reference conductor electrically connected at ends of the cable; a first insulator between the signal conductor and the reference conductor along the length of the cable; a second insulator between the reference conductor and the shield conductor along the length of the cable; and high magnetic permeability material inside the shield conductor.

Example 16 is the cable of Example 15, further comprising high magnetic permeability material outside of the shield conductor.

Example 17 is the cable of either of Examples 15 or 16, wherein the high magnetic permeability material comprises a common mode choke at one or both ends of the cable, the cable further comprising a conductive metal shell electrically connected to the shield conductor.

Example 18 is the cable of any of Examples 15 through 17, wherein the high magnetic permeability material comprises a ferrite.

Example 19 is the cable of any of Examples 15 through 18, wherein the high magnetic permeability material inside the shield conductor lies between the shield conductor and the reference conductor.

Example 20 is the cable of any of Examples 15 through 19, wherein the high magnetic permeability material inside the shield conductor is integrated into material of the second insulator.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific embodiments have been illustrated and described for purposes of illustration, it will be understood that various modifications may be made without departing from the spirit and scope of the disclosure. Accordingly, the invention should not be limited except as by the appended claims.

The invention claimed is:

1. A probe tip for an isolated probe having a triaxial cable, comprising:
   a conductive probe tip interface at one end of the cable;
   a signal conductor, the signal conductor traversing a length of the cable and electrically connected to the conductive probe tip interface;
   a reference conductor surrounding the signal conductor along the length of the cable;
   a shield conductor surrounding the reference conductor at least along the length of the cable, the shield conductor and the reference conductor electrically connected at ends of the probe tip;
   a first insulator between the signal conductor and the reference conductor along the length of the cable;
   a second insulator between the reference conductor and the shield conductor along the length of the cable; and
   high magnetic permeability material inside the shield conductor.

2. The probe tip as claimed in claim 1, wherein the high magnetic permeability material comprises a common mode choke at one or both ends of the cable, and the shield conductor further comprises a conductive shell housing the common mode choke.

3. The probe tip as claimed in claim 1, further comprising high magnetic permeability material outside of the shield conductor.

4. The probe tip as claimed in claim 1, further comprising a printed circuit board connected to an end of the cable opposite the conductive probe tip interface.

5. The probe tip as claimed in claim 4, wherein the printed circuit board includes a common mode choke.

6. The probe tip as claimed in claim 1, wherein the high magnetic permeability material comprises a ferrite.

7. The probe tip as claimed in claim 1, wherein the high magnetic permeability material inside the shield conductor lies between the shield conductor and the reference conductor.

8. The probe tip as claimed in claim 1, wherein the high magnetic permeability material inside the shield conductor is integrated into material of the second insulator.

9. A method of manufacturing a tip for an isolated probe having a triaxial cable, comprising:
- accessing a shield conductor of the triaxial cable, wherein the triaxial cable includes a signal conductor, a first insulator surrounding the signal conductor, a reference conductor surrounding the first insulator, a second insulator surrounding the reference conductor, and the shield conductor surrounding the second insulator;
- inserting a high magnetic permeability material between the shield conductor and the reference conductor in the triaxial cable; and
- electrically connecting the shield conductor to the reference conductor.

10. The method of manufacturing as claimed in claim 9, further comprising placing high magnetic permeability material outside the shield conductor.

11. The method of manufacturing as claimed in claim 9, wherein accessing the shield conductor comprises unbraiding the shield conductor at ends of the cable and wrapping the shield conductor over the high magnetic permeability material before electrically connecting the shield conductor to the reference conductor.

12. The method of manufacturing as claimed in claim 9, wherein accessing the shield conductor comprises removing a portion of the shield conductor at ends of the cable, and the method further comprises:
- placing a braid having a larger diameter than the shield conductor at each end of the cable to hold the high magnetic permeability material; and
- soldering the larger diameter braid to the shield conductor.

13. The method of manufacturing as claimed in claim 9, wherein:
- accessing the shield conductor comprises:
- coating an end of the cable with an anti-fraying material;
- trimming the anti-fraying material; and
- creating openings in an end of the cable, the openings exposing the shield conductor;
- inserting the high magnetic permeability material comprises sliding the high magnetic permeability material into the openings against the shield conductor; and
- removing the anti-fraying material.

14. The method as claimed in claim 13, wherein creating openings comprises using wedges of a material other than the high magnetic permeability material to expand the shield conductor.

15. A triaxial cable, comprising:
- a signal conductor, the signal conductor traversing a length of the cable;
- a reference conductor surrounding the signal conductor along the length of the cable;
- a shield conductor surrounding the reference conductor along the length of the cable, the shield conductor and the reference conductor electrically connected at ends of the cable;
- a first insulator between the signal conductor and the reference conductor along the length of the cable;
- a second insulator between the reference conductor and the shield conductor along the length of the cable; and
- high magnetic permeability material inside the shield conductor.

16. The cable as claimed in claim 15, further comprising high magnetic permeability material outside of the shield conductor.

17. The cable as claimed in claim 15, wherein the high magnetic permeability material comprises a common mode choke at one or both ends of the cable, the cable further comprising a conductive metal shell electrically connected to the shield conductor.

18. The cable as claimed in claim 15, wherein the high magnetic permeability material comprises a ferrite.

19. The cable as claimed in claim 15, wherein the high magnetic permeability material inside the shield conductor lies between the shield conductor and the reference conductor.

20. The cable as claimed in claim 15, wherein the high magnetic permeability material inside the shield conductor is integrated into material of the second insulator.

\* \* \* \* \*